United States Patent [19]

Lane et al.

[11] Patent Number: 4,594,127

[45] Date of Patent: Jun. 10, 1986

[54] METHOD AND APPARATUS FOR GROWING CRYSTALS

[75] Inventors: Richard L. Lane, Penfield; Donald J. Fanale, Rochester, both of N.Y.

[73] Assignee: General Signal Corporation, Stamford, Conn.

[21] Appl. No.: 650,949

[22] Filed: Sep. 17, 1984

[51] Int. Cl.$^4$ .............................................. C30B 15/32
[52] U.S. Cl. .......................... 156/617 R; 156/617 SP; 156/DIG. 98; 269/234; 279/1 SG; 279/28
[58] Field of Search ................ 156/617 SP, DIG. 98; 269/229, 234, 254; 279/28, 32, 1 SG; 403/206, 211, 333, 334, 344, 369, 374, 275; 422/249

[56] References Cited

U.S. PATENT DOCUMENTS

| | | | |
|---|---|---|---|
| 206,321 | 7/1878 | Heaton | 279/28 |
| 1,746,759 | 2/1930 | Baker | 403/206 |
| 2,233,794 | 3/1941 | Noble | 403/369 |
| 3,492,032 | 1/1970 | Deike | 403/369 |
| 3,534,989 | 10/1970 | Yonkers | 403/369 |
| 3,544,142 | 12/1970 | Moss, Jr. | 403/369 X |

FOREIGN PATENT DOCUMENTS

| | | | |
|---|---|---|---|
| 733298 | 10/1932 | France | 403/334 |
| 2013820 | 4/1970 | France | 156/617 SP |

*Primary Examiner*—Arnold Turk
*Assistant Examiner*—Michael S. Gzybowski
*Attorney, Agent, or Firm*—Harold S. Wynn; Thomas R. FitzGerald

[57] ABSTRACT

Method and apparatus for suspending a seed crystal over a fixed crucible containing a melt from a rotary and axially operable vertically disposed drive adaptor comprising the steps of forming a tubular receptacle adapted to be detachably secured at its upper end coaxially to the adapter, and having an internal bore formed therein with an internal step near its lower end for supporting the seed. The seed is formed in the shape of a cylinder of a diameter to pass axially through the stepped bore of the receptacle and having its upper end conically tapered downwardly and inwardly from the upper end thereof. A split sleeve is formed to be receivable downwardly within the internal bore of the tubular receptacle except as limited by the internal steps of the bore of the receptacle. The sleeve has an internal conical taper complimentary to the taper of the upper end of the seed about which it is disposed before insertion of the seed and sleeve within the bore of the receptacle. A light pull and turn of the seed seats the seed within the sleeve, and the sleeve within the receptacle in a manner to be coaxial with the receptacle without requiring mechanical fastenings that can generate stress in the seed and possibly cause breakage of the seed while growing a crystal.

9 Claims, 1 Drawing Figure

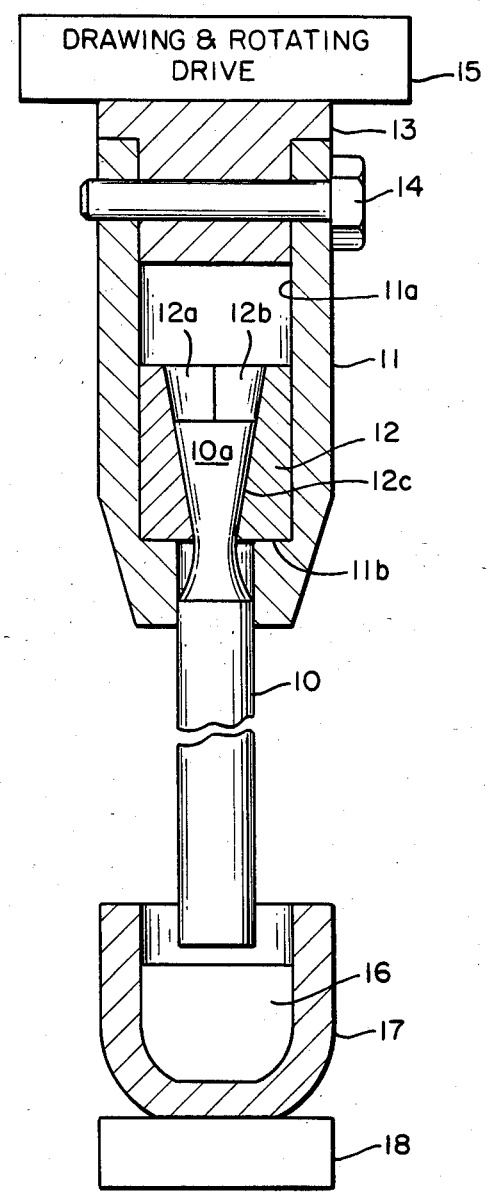

METHOD AND APPARATUS FOR GROWING CRYSTALS

REFERENCE TO PRIOR DISCLOSURES:

The Maruyama U.S. Pat. No. 3,481,711 and the Weiss U.S. Pat. No. 2,851,341 are of interest as background material relative to the present invention and they are incorporated herein by reference as background material.

BACKGROUND OF THE INVENTION

This invention relates to method and apparatus for growing crystals and it more particularly relates to methods and apparatus for suspending a seed from drawing and rotating drive apparatus.

In growing crystals from a melt contained in a crucible, seeds are often under considerable stress at high temperatures which causes the seeds to break in an area where they are secured to drawing and rotating drive apparatus, causing losses in drawing time as well as damage to a melt and a crystal being drawn. Securing a seed to drawing apparatus by one or more wires, as is shown in FIG. 9B, for example, of the Maruyama U.S. Pat. No. 3,481,711, granted Dec. 2, 1969 can create a weak point in suspension of a seed at the point of connection of the wire that can cause breakage of the seed at that point, particularly in the growing of heavy crystals that can weigh as much as 100 lbs. or more. Similarly any attachment of a seed involving pressure of a set screw or a locking pin, for example, also can weaken the seed at the point of attachment to drawing and rotating drive apparatus, and cause waste because of breakage of the seed, causing a crystal being grown to drop into the crucible. Similarly, the tightening of a seed in a threaded chuck as is disclosed, for example, in FIGS. 2 and 4 of the Weiss U.S. Pat. No. 2,851,341 can also setup a weakened pressure point that may be subject to breakage.

Another problem with the above discribed prior art system of attachment of the seeds is to ensure that they are positioned coaxially with the drawing drive apparatus to prevent orbiting of the seed, for example, when it is used in connection with a cable support drive to reduce vibrations and the like. If the center of gravity of the seed is off center, rather than being coaxial with the drive, this may result in an inferior crystal because of orbiting of the crystal as it is grown. Furthermore seeds are ofsten cleaned by etching, which disolves a small layer of silicon from the surface. Square seeds or notched round seeds often lose accurate axial orientation in the etching process because of longitudinal unevenness in the surface of the seed caused by the etching.

An object of the present invention is to provide improved methods and apparatus for growing crystals that substantially obviates one or more of the limitations and disadvantages of the described prior art systems.

Another object of the present invention is to provide an improved method and apparatus for attaching a seed to rotating and drawing drive apparatus without generating pressure points in suspension of a seed from a receptacle.

Another object of the present invention is to provide an improved method and apparatus for coaxially suspending a seed from a receptacle in a more balanced coaxial manner for growing more uniform cylindrical crystals.

SUMMARY OF THE INVENTION

The invention is for methods and apparatus for suspending a seed over a fixed crucible containing a melt from a rotary and axially operable vertically disposed adapter, which may be suspended from drive apparatus by a cable, for example, for maintaining a minimum amount of vibration transmission from the drive to a crystal being grown from the lower end of the seed. A tubular receptacle is adapted to be detachably secured to the adapter, having an internal bore formed therein with an internal step near its lower end for supporting the seed. The seed is formed in the shape of a cylindrical rod of a diameter to pass axially through the stepped bore of the receptacle, the seed having its upper end conically tapered downwardly and inwardly from the upper end thereof as by turning in a lathe. A split sleeve is formed to be receivable downwardly within the internal bore of the tubular receptacle except as limited by the internal stepped bore of the receptacle, the sleeve having an internal machined conical taper complimentary to the taper of the upper end of the seed. The conical portion of the seed is assembled within the conical portion of the split sleeve before insertion of this subassembly downwardly within the receptacle until limited by the stepped portion of the receptacle, before detachably securing the upper end of the receptacle to the adapter. By pulling the seed downwardly, while turning it within the sleeve, the seed becomes coaxial with the receptacle and the drive unit, without the need for mechanically attaching the seed to the receptacle. The seed is thus supported solely from its machined conical portion for accurate coaxial alignment with the receptacle.

The drawing is an elevational view, partly in cross section, of typical crystal growing apparatus according to a preferred embodiment of the present invention.

With reference to the drawing, a system for growing crystals comprises a seed 10 removably secured within a receptacle 11 by a split sleeve 12, the receptacle 11 being detachably secured to an adapter 13 by a pin 14, and the adapter 13 being subject to rotation and drawing by a conventional drive apparatus 15 illustrated by block diagram.

The seed 10 is adapted to grow a crystal from a melt 16 contained in a crucible 17 resting on a suitable base 18. The seed 10 is preferably formed as a cylindrical rod, as by core-drilling, which, if done properly, produces highly accurate dimensions and orientation. The upper end 10a of the rod 10 is formed with a smooth uniform conical downward taper, as by turning in a lathe.

The split sleeve 12 is formed of parts 12a and 12b having an interior conical taper 12c machined to be complimentary to the taper of the upper end 10a of the seed 10.

The sleeve 12 is preferably formed to have a close sliding fit within a bore 11a of the receptacle 11, and the sleeve bottoms on an internal stepped bore 11b of receptacle 11 to limit the downward movement of the seed 10 and maintain the seed 10 firmly in close coaxial alignment with the receptacle 11 throughout a crystal growing operation. Typical dimensions that have been found satisfactory for the rod of a seed 10 is that the rod can be 0.5" in diameter, and the upper end 10a can taper from 0.5" to 0.375" in diameter.

In operation, the receptacle 11 is detached from the adapter 13 by removal of the pin 14, the upper end 10a of the seed 10 is assembled within the sections 12a and 12b of the sleeve 12 about the inverted conical end 10a of the seed 10. The sleeve 12 and seed 10 are then guided into the upper end of the receptacle 11, within the bore 11a, and the sleeve 12 is allowed to drop to the lower end of the bore 11a, where it is supported on the step 11b of the receptacle 11. A light pull and twist on the seed seats it snugly, aligning it, and preventing any motion relative to the receptacle.

The receptacle 11 and the sleeve 12 are preferably made of graphite, however, other suitable refractory material may be used.

To remove a grown crystal, the receptacle 11 is removed from the adapter 13 after removal of pin 14, and the seed 10 is moved upwardly until the split sections 12a and 12b can be removed from around the upper end 10a of the seed 10 to permit the seed 10 to be removed from the lower end of the receptacle 11.

By carefully turning the conical portion 10a of the seed 10, and the complimentary supporting surface 12c of the sleeve 12, and supporting the seed 10 solely in the machined conical portion 10a, optimum coaxial alignment of the seed with the drawing and rotating drive 15 is obtained for growing a uniform cylindrical crystal.

Having thus described a method and apparatus for supporting a seed in growing crystals, according to a preferred embodiment of the present invention, it is to be understood that various modifications and alterations may be made to the specific embodiment shown, without departing from the spirit or scope of the invention.

What is claimed is:

1. The method of detachably suspending a seed crystal, over a crucible containing a melt, from a rotary and axially operable vertically disposed adapter comprising the steps of;
   (a) forming a tubular receptacle having upper and lower ends, said tubular receptacle being detachably securable at its upper end, in a coaxial manner to an adapter and having an internal bore formed therein with an internally stepped bore portion defining an opening near the lower end for supporting a seed crystal.
   (b) forming the seed crystal integrally in the shape of a cylindrical rod having a diameter of sufficient size to pass through the stepped opening of the tubular receptacle in either axial direction and having an upper end conically tapered downwardly and inwardly for a limited distance from the upper end thereof,
   (c) forming a split sleeve of sufficient size to be downwardly receivable within the internal bore of the tubular receptacle and limited in a downward movement by the internal stepped opening of the tubular receptacle.
   (d) the split sleeve having an internal conically tapered bore complimentary shaped to the taper of the upper end of the seed crystal,
   (e) suspending the seed crystal from the adapter by hand, without the use of force, comprising the steps of,
      (1) firstly, placing the split sleeve around the tapered upper end of the seed crystal,
      (2) secondly, inserting the seed crystal and split sleeve downwardly in the bore of the tubular receptacle until the split sleeve rests at the internal stepped opening of the tubular receptacle, and,
      (3) thirdly, detachably securing the upper end of the tubular receptacle coaxially to the adapter,
   (f) whereby the seed crystal is operably secured coaxially within the tubular receptacle to be rotated and axially movable by the adapter solely because of frictional connecting forces between the seed crystal and the split sleeve and between the split sleeve and the internal bore of the tubular receptacle as governed by the weight of the seed crystal and the weight of a crystal as it is grown.

2. The method of detachably suspending a seed crystal, over a crucible containing a melt, from a rotary and axially operable vertically disposed adapter and growing a crystal thereby, comprising the method of detachably suspending a seed crystal as set forth in claim 1 and further comprising the sequential steps of,
   (a) providing a crucible containing a melt under the adapter,
   (b) drawing a crystal from the melt,
   (c) detaching the tubular receptacle from the adapter,
   (d) sliding the seed crystal and the split sleeve upwardly within the stepped bore of the tubular receptacle to permit the split sleeve to be removed from the conically tapered portion of the seed, crystal,
   (e) removing the split sleeve from the seed crystal and,
   (f) removing the seed crystal with the drawn crystal attached from the lower end of the tubular receptacle through the stepped opening.

3. The method of detachably suspending a seed crystal according to claim 1 wherein the seed crystal is suspended only by its conically tapered portion in contact with the split sleeve which is supported by the tubular receptacle.

4. The method of detachably suspending a seed crystal according to claim 1 comprising an additional step of drawing the seed crystal downwardly within the split sleeve to assure centering of the seed crystal within the split sleeve and in axial alignment with the adapter.

5. The method of detachably suspending a seed crystal according to claim 4 comprising an additional step of rotating the seed crystal within the split sleeve to assure smooth frictional surface contact between the seed crystal with the split sleeve, in axial alignment and the adapter.

6. In a system for growing crystals comprising a cylindrical seed crystal for drawing a crystal from a melt, drive means for rotating and drawing an adapter, and connecting means for detachably connecting the seed crystal to the adapter, wherein the improvement comprises said connecting means comprising;
   (a) a tubular receptacle coaxial with the seed crystal and adapted for detachably connecting the seed crystal to the adapter,
   (b) the tubular receptacle having an internal bore with a stepped bore, portion
   (c) the seed crystal being cylindrical and of a sufficient diameter to pass through the stepped bore of the tubular receptacle in either axial direction and having an upper end tapered conically downwarldy and inwardly for a predetermined distance from the upper end thereof,
   (d) a split sleeve of sufficient size to be coaxially receivable within the internal bore of the tubular receptacle and limited from movement therethrough by the internally stepped bore portion of the tubular receptacle, the split sleeve having an internal conically tapered bore complimentary shape to the conical taper of the seed crystal for receiving the conically tapered portion of the seed crystal therein, for limiting downward movement of the seed crystal within the tubular receptacle, and for coaxially locating the seed crystal within the tubular receptacle, and, (e) the split sleeve having at least two longitudinally separable sections to permit assembly of the split sleeve around the upper end of the seed crystal before insertion of the split sleeve within the tubular receptacle.

7. A system for growing crystals according to claim 6 wherein the improvement further comprises being the seed crystal rotatable through friction contact with the split sleeve to cause the seed crystal to be rotated by rotation of the split sleeve and the tubular receptacle.

8. A system for growing crystals according to claim 7 wherein the improvement further comprises being the seed crystal supported by contacting the split sleeve only at the conically tapered portion of the seed crystal.

9. The method of detachably suspending a seed crystal over crucible containing a melt from a rotary and axially operable vertically disposed adapter and growing a crystal thereby comprising the steps of;

(a) forming a tubular receptacle having upper and lower ends, said tubular receptacle being detachably securable at its upper end, in a coaxial manner, to an adapter and having an internal bore formed therein with an internally stepped bore portion defining an opening near the lower end for supporting a seed crystal.

(b) forming the seed crystal integrally in the shape of a cylindrical rod having a diameter of sufficient size to pass through the stepped opening of the tubular receptacle in either axial direction and having an upper end conically tapered downwardly and inwardly for a limited distance from the upper end thereof, (c) forming a split sleeve of a sufficient size to be downwardly receivable within the internal bore of the tubular receptacle and limited in a downward movement by the internal stepped opening of the tubular receptacle, (d) the split sleeve having an internal conically tapered bore complimentary shaped to the taper of the upper end of the seed crystal, (e) suspending the seed crystal from the adapter by hand, without the use of force, comprising the steps of,
  (1) firstly, placing the split sleeve around the tapered upper end of the seed crystal,
  (2) secondly, inserting the seed crystal and split sleeve downwardly in the bore of the receptacle until the split sleeve rests at the internal stepped opening of the tubular receptacle, and,
  (3) thirdly, detachably securing the upper end of the tubular receptacle coaxially to the adapter, (f) providing a crucible containing a melt under the adapter, (g) drawing a crystal from the melt, (h) detaching the seed crystal from the adapter without detachment of the seed crystal from the drawn crystal comprising the steps of,
  (1) detaching the tubular receptacle from the adapter,
  (2) sliding the seed crystal and the split sleeve upwardly within the stepped bore of the tubular receptacle to permit removal of the split sleeve.
  (3) removing the split sleeve from the seed crystal above the tubular receptacle, and
  (4) removing the seed crystal with the drawn crystal still attached through the stepped opening at the lower end of the tubular receptacle.

(i) whereby the seed crystal can be attached to the tubular receptacle and subsequently detached from the tubular receptacle with a drawn crystal attached to the seed crystal, without the use of force, the seed crystal being insertable into the internal bore of the tubular receptacle from the top or bottom of the tubular receptacle to be attached to the tubular receptacle, and the seed crystal being removable from the tubular receptacle through the internal stepped opening near the lower end, of the tubular receptacle after the split sleeve has been removed.

* * * * *